United States Patent [19]

Fang

[11] Patent Number: 5,566,083

[45] Date of Patent: Oct. 15, 1996

[54] METHOD FOR ANALYZING VOLTAGE FLUCTUATIONS IN MULTILAYERED ELECTRONIC PACKAGING STRUCTURES

[75] Inventor: Jiayuan Fang, Vestal, N.Y.

[73] Assignee: The Research Foundation Of State University Of New York, Albany, N.Y.

[21] Appl. No.: 325,006

[22] Filed: Oct. 18, 1994

[51] Int. Cl.[6] ................................................. G01R 31/30
[52] U.S. Cl. ............................................ 364/489; 364/485
[58] Field of Search .................................... 364/488, 489, 364/490, 491, 578, 485, 484, 483; 257/666, 703

[56] References Cited

U.S. PATENT DOCUMENTS

| | | | |
|---|---|---|---|
| 4,594,677 | 6/1986 | Barlow | 364/578 |
| 5,095,359 | 3/1992 | Tanaka et al. | 257/703 |
| 5,221,858 | 6/1993 | Higgins, III | 257/666 |

OTHER PUBLICATIONS

Equivalent Circuit Models Of Via Interconnections In Eltronics Packaging, IEEE 1994.
Electrical Performance Of Electronic Packaging, IEEE Nov. 2, 1994.
1994 IEEE Multi–Chip Module Conference MCMC–94, IEEE Mar. 15, 1994.
Model Of Interaction Between Signal Vias And Metal Planes In Elect. Packaging, IEEE 1994.
Modeling Of Power/Ground Plane Noise In High Speed Digital Elect. Packaging, IEEE 1993.

*Primary Examiner*—Kevin J. Teska
*Assistant Examiner*—Dan Fiul
*Attorney, Agent, or Firm*—Salzman & Levy

[57] ABSTRACT

The present invention features a method for analyzing voltage fluctuations in multilayered electronic packaging structures. A physical electronic packaging structure having at least two, spaced-apart, metallic planes and a via are first provided. This package has an inherent input impedance associated with the via and is essentially dependent upon the radius of the via. A numerical model of a portion of the physical electronic packaging structure containing the via is made. An effective input impedance of the numerical model is then obtained. A unique impedance transforming operation is used to cause the effective input impedance of the numerical model to essentially match the input impedance of the physical structure, thus allowing an accurate simulation of the physical structure.

16 Claims, 13 Drawing Sheets

METHOD FOR ANALYZING VOLTAGE FLUCTUATIONS IN MULTILAYERED ELECTRONIC PACKAGING STRUCTURES

FIELD OF THE INVENTION

Using numerical methods, this invention pertains to the simulation of voltage fluctuations in electronic packaging structures and, more particularly, to the use of impedance transformation on model voltage fluctuations on the ground and/or voltage planes of multilayered chip substrates, chip carriers and printed circuit cards or boards.

BACKGROUND OF THE INVENTION

Electronic packaging refers to the physical implementations of electrical circuits of integrated circuit (IC) chips, modules, chip or module carriers, cards, boards or backplanes. Such components and devices are often referred to as electronic packaging structures. The terms "electronic packaging structure", "electronic package" and "package" are hereinafter used interchangeably to refer to any or all of the aforementioned devices and structures. For purposes of this discussion, such structures include multilayered packaging, in which a plurality of substantially parallel conductive planes (designated as ground and/or power planes) are separated from one another by non-conductive dielectric material.

It has long been the practice of digital electronic system designers to employ simulation techniques to predict the ultimate behavior of those systems before the actual hardware implementation thereof. As large-scale integration (LSI) and very large-scale integration (VLSI) techniques have allowed greater numbers of circuits to be packaged in smaller spaces, it has become increasingly difficult to construct physical prototypes of proposed digital systems prior to the actual construction of the chip. Therefore, although the simulation of proposed systems was once merely advisable, it is now necessary.

Because of ever-increasing IC transition speed, power/ground noise (known as simultaneous switching noise [SSN] or delta-I noise) has posed a significant challenge to reliable, high-speed IC operation. Numerous problems arising therefrom (such as larger delays, the loss of signal integrity and false switching of devices) can lead to the malfunctioning of overall systems.

SSN or delta-I noise is generated when a logic gate changes state, thereby altering the current flow in a system. The resulting change in current (delta-I) induces transient voltage variations in nearby metallic planes and/or conductors. Of particular interest are voltages induced in the voltage supply and/or ground planes that are usually found in multilayered packages. The effects of noise on actual hardware must be accounted for in any system simulation for the simulation to predict true hardware system performance.

One early attempt to account for delta-I noise is shown in U.S. Pat. No. 4,594,677 (entitled SYSTEM FOR DETECTING AND DIAGNOSING NOISE CAUSED BY SIMULTANEOUS CURRENT SWITCHING) issued to John P. Barlow. Barlow teaches the inclusion of a data file of predetermined delta-I noise "events" which may be integrated with a description of the logic of a digital system to be simulated. The effects of such noise events are then accounted for during the simulation. While an advancement over previous simulation systems, Barlow's system presupposes that a wide variety of relevant delta-I noise events had been accurately captured, events encompassing all possible worst-case scenarios. Since noise events can vary widely from circuit to circuit and, certainly, from package to package, this technique is not suited for the accurate simulation of a wide variety of packages.

Other methods of simulating delta-I noise have focused on modeling the noise-generating mechanisms within the package. Modeling conductive planes using such techniques as lumped, or, effective, inductance are well known in the art. Lumped or effective inductor modeling is valid only at low frequencies; it fails to take into account wave propagation and resonance in power and ground planes. Thus, this technique is unsuitable for modeling high-speed packaging structures.

A technique known as the wire antenna model computes currents in conducting wires using "Method of Moments". The "Method of Moments" is an integral equation method usually formulated in the frequency domain. While this technique is useful for wave propagation effects, the long computation times required for complex multi-layer packaging structures makes it impractical. Another limitation of the wire antenna model is that it computes in the frequency domain; it can, therefore, can not be conveniently linked to time domain circuit simulators.

Yet another technique utilizes a capacitor/inductor mesh to model power and ground planes. For example, this technique is used in the IBM® ASTAP simulation system. It, too, requires long computation times and the usage of large memory space.

Other high-accuracy techniques employing full-wave electromagnetic field solvers are also available. For example, three-dimensional finite difference time domain (FDTD) or finite elements may be applied. These require quite large computer resources (long computation times, as well as huge memory space), making them impractical for modeling practical package designs.

Numerical techniques have been proposed which take into account wave propagation and resonance effects. These techniques often impose a mesh or a grid to divide the space between planes into small spaces or elements. However, these methods fail to provide consistently accurate simulations of hardware systems due to the complex interactions between a chosen mesh size and critical physical dimensions within a package.

SUMMARY OF THE INVENTION

In accordance with the present invention, there is provided a method for analyzing voltage fluctuations in multilayered electronic packaging structures. A physical electronic packaging structure having at least two, spaced-apart, metallic planes and a via are first provided. This package has an inherent input impedance associated with the via and is dependent essentially upon the radius thereof.

A numerical model of a portion of the physical electronic packaging structure containing the via is made. An effective input impedance of the numerical model is then obtained. A unique impedance transforming operation is used to cause the effective input impedance of the numerical model to essentially match the input impedance of the physical structure, thereby allowing an accurate simulation thereof.

A mesh segmentation technique is employed. The effective input impedance of a desired area of a physical package may be either measured or analytically derived. With an impedance transforming mechanism, the effective input impedance of the corresponding numerical model is tailored to correspond to the effective input impedance of the physical system of the simulation model. The simulation system of the present invention yields accurate results that are essentially independent of either the mesh size chosen or the effective radius of via pins in the package.

The inventive method is disclosed in part in a paper entitled "Modeling of Electrical Properties of Power/Ground Planes in Electronics Packaging" by J. Fang, Y. Chen and Z. Wu, that was presented at the First International Symposium on Microelectronic Package & PCB Technology in Beijing, China, Sept. 19–23, 1994.

BRIEF DESCRIPTION OF THE DRAWINGS

A complete understanding of the present invention may be obtained by reference to the accompanying drawings, when taken in conjunction with the detailed description thereof and in which:

FIG. 1b is a cross-sectional schematic view of the planes of FIG. 1a;

DESCRIPTION OF THE PREFERRED EMBODIMENT

Integrated circuit chip or module substrates, chip carriers and printed circuit cards or planar boards generally comprise a number of laminated layers. These layers are made up of conductive (usually metallic) material that are, in turn, separated by insulating layers of appropriate thickness. The conductive layers or planes may be voltage supply planes or ground planes. External or interplanar connections are made to various planes of the multilayered structure by via pins, normally referred to as "vias". Vias are either electrically connected to a particular plane, or they may pass through a plane, being insulated therefrom by a hole therein, which is of sufficient diameter to provide the necessary electrical properties.

Figure 1A:
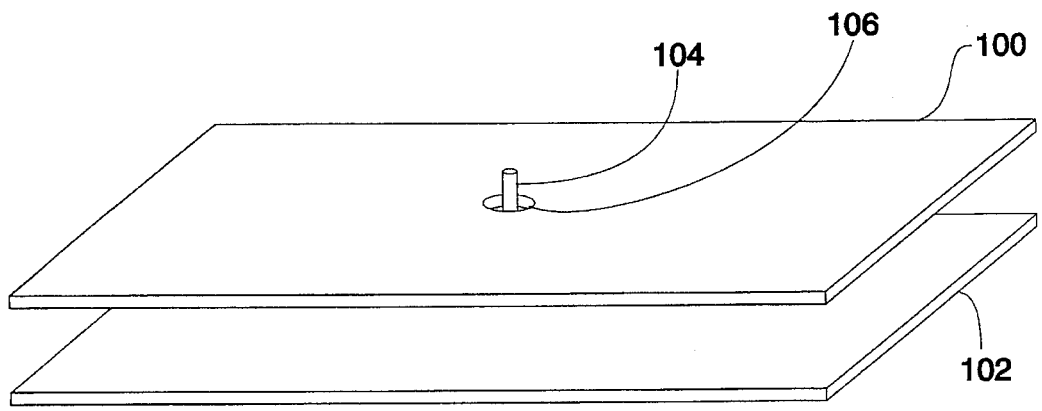
FIG. 1a is a schematic representation of two planes of an electronic package.
Figure 1B:
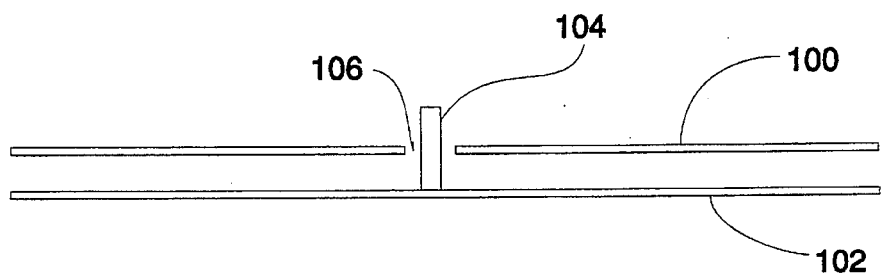
Figure 1C:
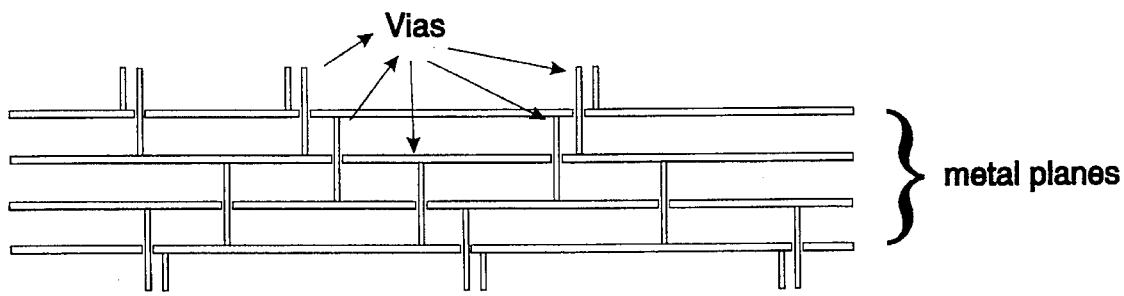
FIG. 1c is a cross-sectional schematic view of multiple planes and vias.

FIG. 1a depicts two planes 100 and 102 of a typical multilayered package (not shown), with a single via pin 104 passing from the lower plane 102 through upper plane 100. Via pin 104 is insulated from plane 100 by the surrounding hole 106 in plane 100. FIG. 1b depicts a cross-sectional view of planes 100 and 102, via pin 104 (shown as being electrically connected to plane 102) and insulating hole 106 as depicted in FIGS. 1a and 1b. FIG. 1c depicts a cross-sectional view of a portion of a more complex package having four, conductive, metal planes and many via pins in a variety of configurations connecting the four planes.

Figure 1D:
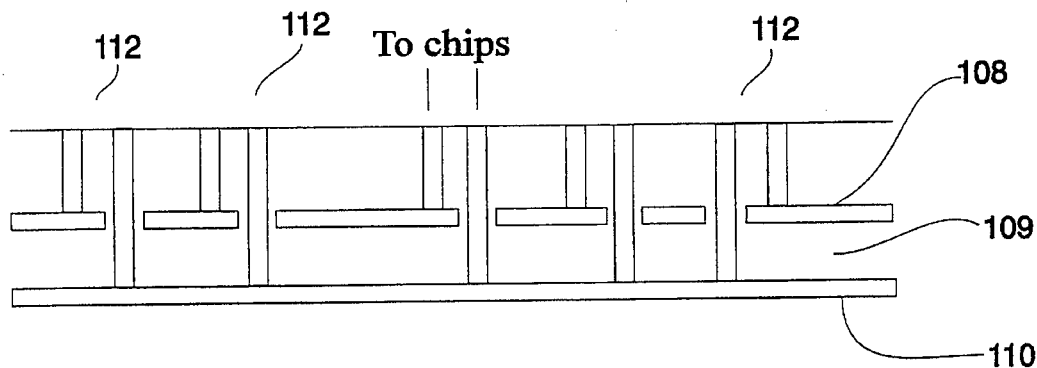
FIG. 1d is a cross-sectional schematic view of power and ground planes of a chip carrier.

FIG. 1d shows a typical application of the multilayered structure of FIG. 1c. A variety of modules (not shown) are connected to two planes of a multi-plane structure, a power plane 108 and a ground plane 110. Planes 108 and 110 are separated by an insulating layer 109. A pair of via pins shown generally at reference numeral 112 are connected to the power plane 108 and ground plane 110. Via pins 112 provide power and ground connections to a plurality of modules (not shown) mounted upon the structure.

Figure 2:
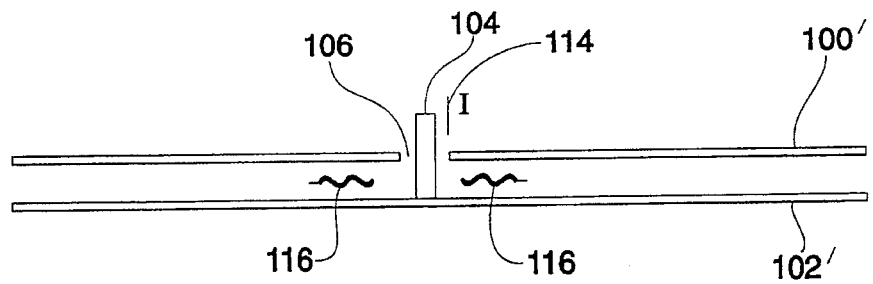
FIG. 2 is a cross-sectional schematic view of power and ground planes, showing a current on a single via and the resulting induced electromagnetic fields propagating from the via in the planes.
Figure 3:
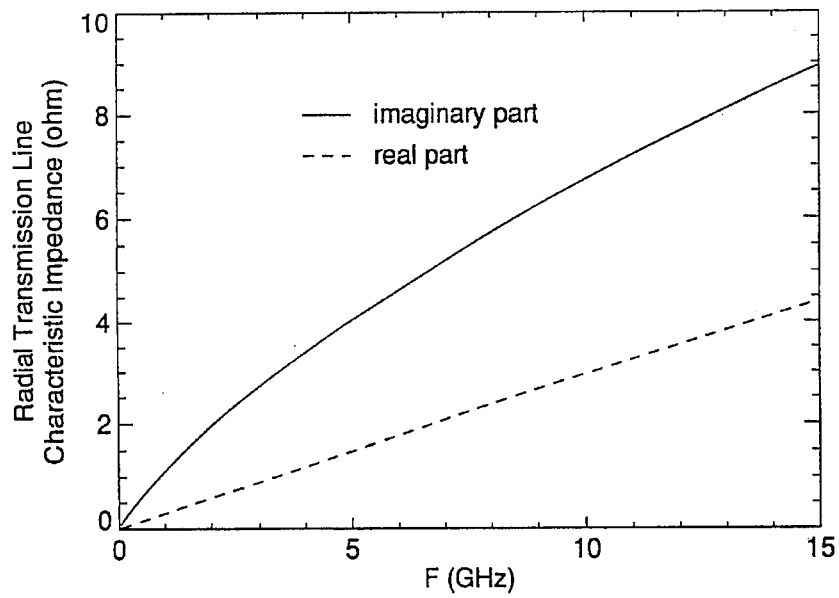
FIG. 3 is a plot of the real and imaginary components of the impedance of a radial transmission line formed by the via and conductive planes of FIG. 2.

Referring now to FIG. 2, there is shown a power plane 100' and a ground plane 102' which are assumed, for purposes of discussion, to be infinitely large. A via hole 106 is located in the center of planes 100' and 102'. The structure formed by planes 100' and 102' and via 104 appears to be a radial transmission line. Therefore, the impedance that is observed when looking into the junction of via 104 and planes 100' and 102' is the characteristic impedance of a radial transmission line. The characteristic impedance of a radial transmission line may be expressed as:

$$Z_0(\alpha) = \frac{j\eta d}{2\pi\alpha} \frac{H_0^{(2)}(k\alpha)}{H_1^{(2)}(k\alpha)}, \tag{1}$$

where η and K are the wave impedance and wave number of the medium between the power plane 100' and the ground plane 102', d is the distance between the power plane 100' and ground plane 102', a is the effective radius of via 104, $H^{(2)}_0$ and $H^{(2)}_1$ are the zero$^{th}$ and first order of Hankel's Function of the second kind. The characteristic impedance of the radial transmission line $Z_0(a)$ is frequency-dependent. As an example, the real and imaginary parts of $Z_0(a)$ as a function of frequency when the radius of the via 104 is 75 μM are shown in FIG. 3. When via 104 carries a time-varying or surge current 1 114, the voltage generated between planes 100' and 102' at the input of this radial transmission line (i.e., at via hole 106) is simply:

$$V = Z_0(a) \cdot I \tag{2}$$

Figure 4:
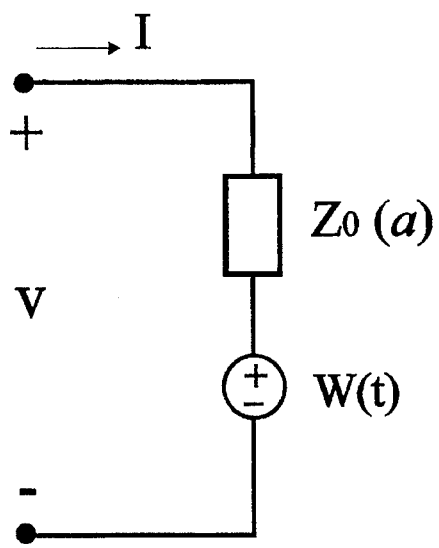
FIG. 4 is an electrical schematic diagram of the equivalent circuit of the structure formed by the via and planes of FIG. 2 where the planes are considered to be infinite.

The amplitude of the voltage is frequency-dependent and is a function of the effective radius of via 104. FIG. 4 shows an electrical schematic diagram of the equivalent circuit corresponding to and deflated by Equation 2.

Figure 5:
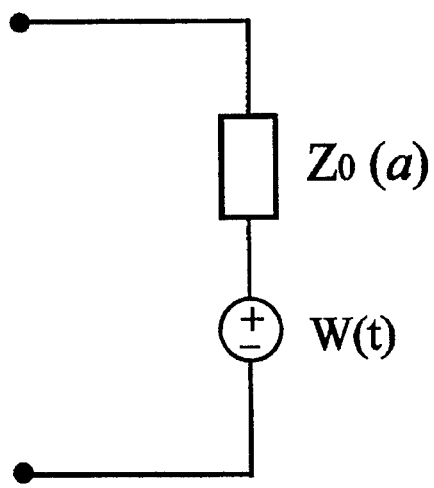
FIG. 5 is an electrical schematic diagram of the equivalent circuit of the structure formed by the via and planes of FIG. 2 where the planes are of finite size.

The power and ground planes 100' and 102' (FIG. 2) have been assumed to be infinite in the x-y plane. In practical situations, power and ground planes are of finite sizes (usually tens of square centimeters), typically with hundreds of vias. Electromagnetic waves are, therefore, reflected from the edges of conductive planes and perturbed by the presence of adjacent vias. The electrical schematic diagram of the equivalent circuit at a particular via hole 106 is shown in FIG. 5, where, besides the characteristic impedance of the radial transmission line $Z_0(a)$, the voltage source W(t) represents the voltage due to reflections from the edges of conductive planes, and due to the currents in adjacent vias.

The numerical techniques which follow utilize some of the analytical insights previously described. These techniques have been found able to perform accurate and fast simulation of SSN in complex packaging structures having multilayered power and ground planes and hundreds of vias. Transient circuit responses are solved by utilizing a combination of a plane solver and circuit solvers. A plane solver refers to a computer program that computes the transient voltages and currents in a package which contains multiple conductive planes and vias. A circuit solver refers to a computer program that computes the transient responses of lumped circuit networks external to the multilayer package structures.

Figure 6A:
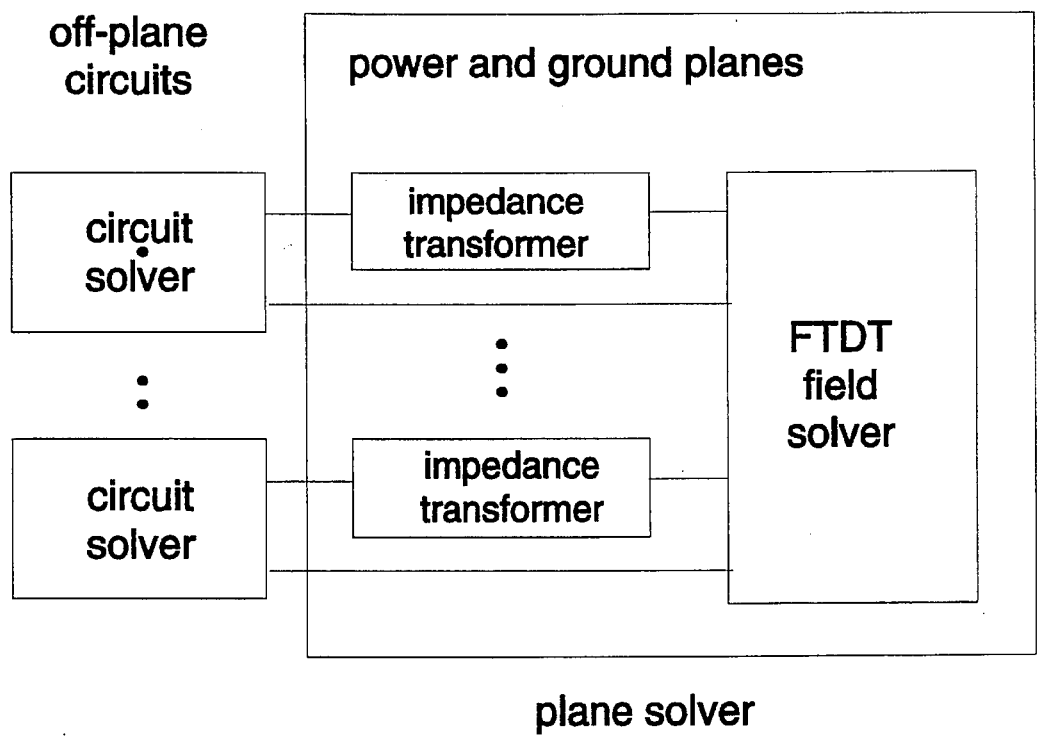
FIG. 6a is a block diagram of the functional components used in the present invention.

Referring now to FIG. 6a, there is shown a block diagram showing the interrelationship of the computation components comprising plane solvers (shown generally at reference number 200) and circuit solvers (shown generally at reference number 202). In addition, impedance transformers 204 are shown. Electromagnetic waves between power and ground planes are computed by the plane solver 200. Voltages and currents in lumped circuit components (drivers, receivers, decoupling capacitors, etc.), which are connected to power and ground planes through vias, are computed by the circuit solver 202 using circuit analysis techniques. The plane solver 200 consists of two parts, a special two-dimensional Finite-Difference Time Domain (FDTD) field solver 206 and an input impedance correction component known as an impedance transformer 204.

Figure 6B:
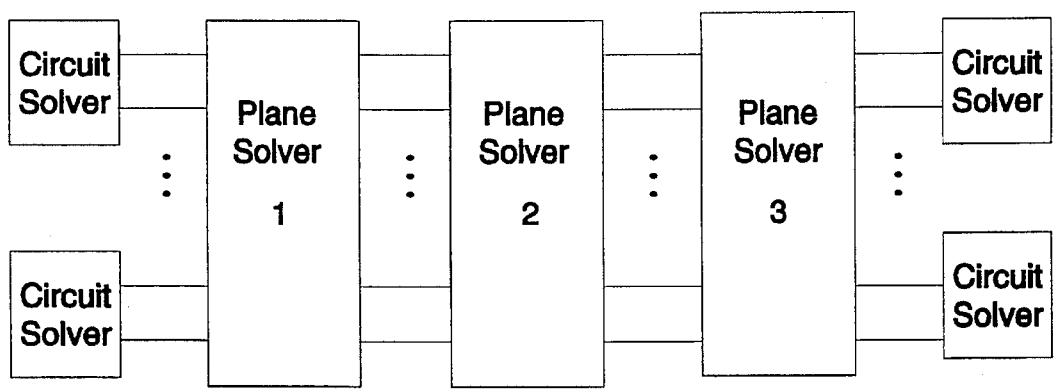
FIG. 6b is a block diagram of the functional components used in the present invention as they are applied to multiple planes.

For multilayered packaging structures, each dielectric layer may have a different dielectric constant and a different thickness. Referring now to FIG. 6b, there is shown a block diagram of a computation scheme for processing multilayered packaging structures. Electromagnetic waves between each pair of conductive planes are computed by a plane solver 200. Adjacent plane solvers are connected at the locations of via holes on the conductive plane which separates two dielectric layers.

In practical packaging structures, the separation between the power and ground planes is usually much less than the size of the power and ground planes. When that is the case, a good approximation results from assuming that the fields between the power and ground planes do not vary in the direction perpendicular to the planes. Therefore, electromagnetic fields in the power and ground planes can be approximated by two-dimensional fields. The two-dimensional fields are governed by the differential equations described below. Define a scaler V(x, y, t) to be the potential difference between two adjacent conductive planes at a location (x, y) and at a time t. Define a vector J(x, y, t) be the current density on the surface of one of the conductive planes. The current density on the surface of the adjacent conductive plane is in the direction opposite the current density on the surface of the first plane. The differential equations for V(x, y, t) and J(x, y, t), which can be derived directly from Maxwell's equations, are:

$$\nabla V(x,y,t) = -L_s \frac{\partial J(x,y,t)}{\partial t} \tag{3}$$

$$\nabla \cdot J(x,y,t) = -C_s \frac{\partial V(x,y,t)}{\partial t}, \tag{4}$$

where $L_s$ is the inductance per square, and $C_s$ is the capacitance per unit area. At the edge of the power and ground planes, the current normal to the edges are assumed to be zero.

Figure 7:
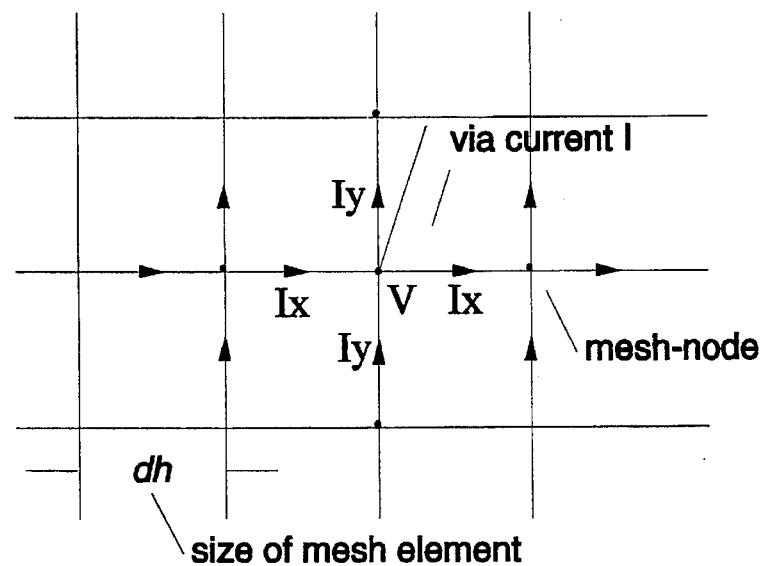
FIG. 7 is a schematic of a two-dimensional mesh model showing current flowing in a via modeled by a current flowing into a mesh node.

Two-dimensional field solvers for the numerical solution of the two dimensional fields governed by Equations (3) and (4) can be based on various numerical techniques. These numerical techniques typically use a mesh to divide the power and ground planes into small elements. The location of a vias is assigned to the nearest mesh-node. As shown in FIG. 7, the electric current flowing through a via onto a conductive plane is modeled by the current flowing into the mesh-node.

Figure 8:
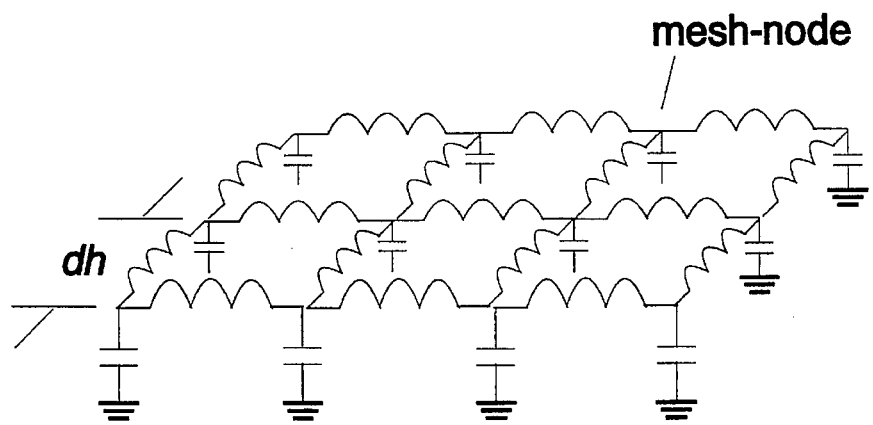
FIG. 8 is a schematic diagram of a capacitor/inductor mesh model.

The power and ground plane structure divided by a mesh can then be solved by solving the lumped capacitor and inductor mesh model as shown in FIG. 8, or by a two-dimensional transmission line model, or by conventional finite-difference or finite-element methods.

The capacitor and inductor mesh model is shown in FIG. 8, each capacitor representing the capacitance between two conductive planes of the corresponding mesh element, and two inductors of a mesh element representing the inductances of the mesh element in the x and y directions. The model shown in FIG. 8 is for lossless conductive planes and a lossless dielectric medium between the conductive planes. If the dielectric medium has loss, a resistor must be added in parallel connection with each capacitor. If the loss of the conductive plane needs to be considered, a resistor must be added in series with each inductor.

With the two-dimensional transmission line model, connections between each adjacent mesh-nodes shown in FIG. 8, in both x and y directions, are represented by a transmission line with a length equal to the length of the mesh element.

In finite-difference or finite-element methods, unknown variables V(x, y, t) and J(x, y, t), which are continuous in space, are approximately represented by their discrete values at mesh-nodes and/or on edges of mesh elements. The resultant discrete variables are solved by finite-difference or finite-element equations.

The aforementioned numerical techniques all have a common inherent error in the modeling of voltage fluctuation between conductive planes, discussed in greater detail below. Results obtained from these numerical techniques strongly depend on the size of the mesh element selected. This phenomena is illustrated in the following examples. As the first example, consider the configuration shown in FIG. 9. Assume that the power and ground planes are each 6 cm ×6 cm in size, separated by a distance d=150 µm and filled by a dielectric material of $\epsilon_r$=4. Vias are 75 µm in radius. To simplify analysis, the vias are not extended beyond the power/ground planes in the vertical direction. The switching current ΔI is modeled as a current source connected across vias. The waveform of the current source is a pulse.

Figure 10:
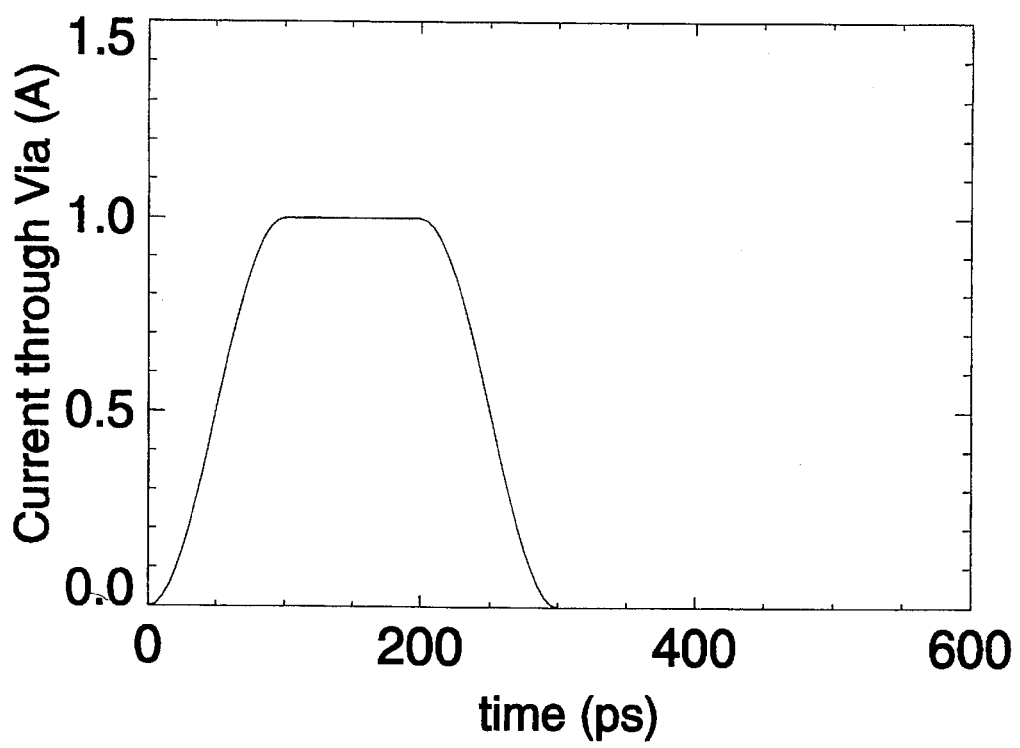
FIG. 10 is a plot of the current waveform used for simulation.

Referring now to FIG. 10, there is shown the waveform of the applied current. It may be observed that the applied pulse is essentially a square wave with sinusoidal features at its leading and trailing edges. The 0–100% rise and fall times of the pulse are assumed to be identical. In addition, the amplitude of the pulse is assumed to be unity, 1 ampere.

Figure 11:
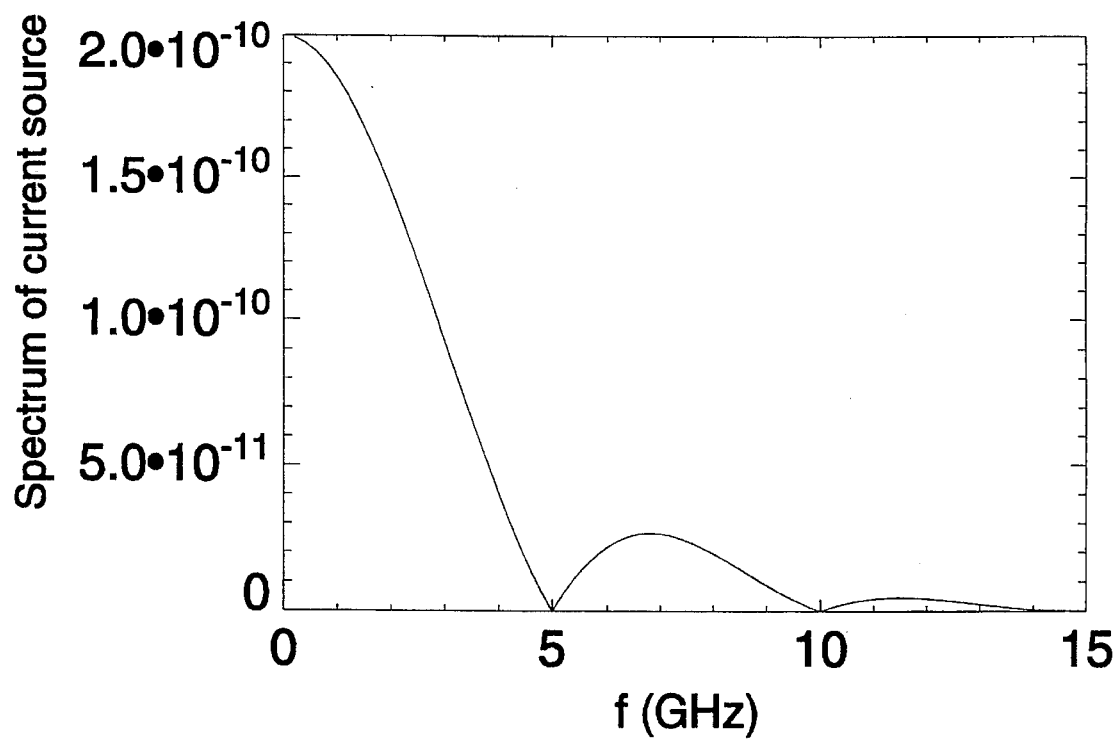
FIG. 11 is a plot of the frequency spectrum of the current waveform shown in FIG. 10.

Referring now to FIG. 11, there is shown the frequency spectrum of a pulse having a rise time of 100 pS. It may be seen that the bulk energy of the pulse is essentially contained below 5 gHz.

Figure 9:
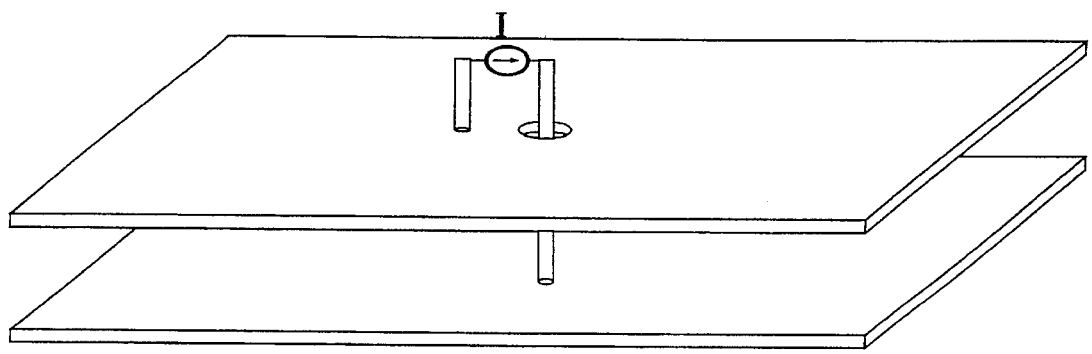
FIG. 9 is a schematic representation of two planes and two vias with current flowing between the two vias.
Figure 12A:
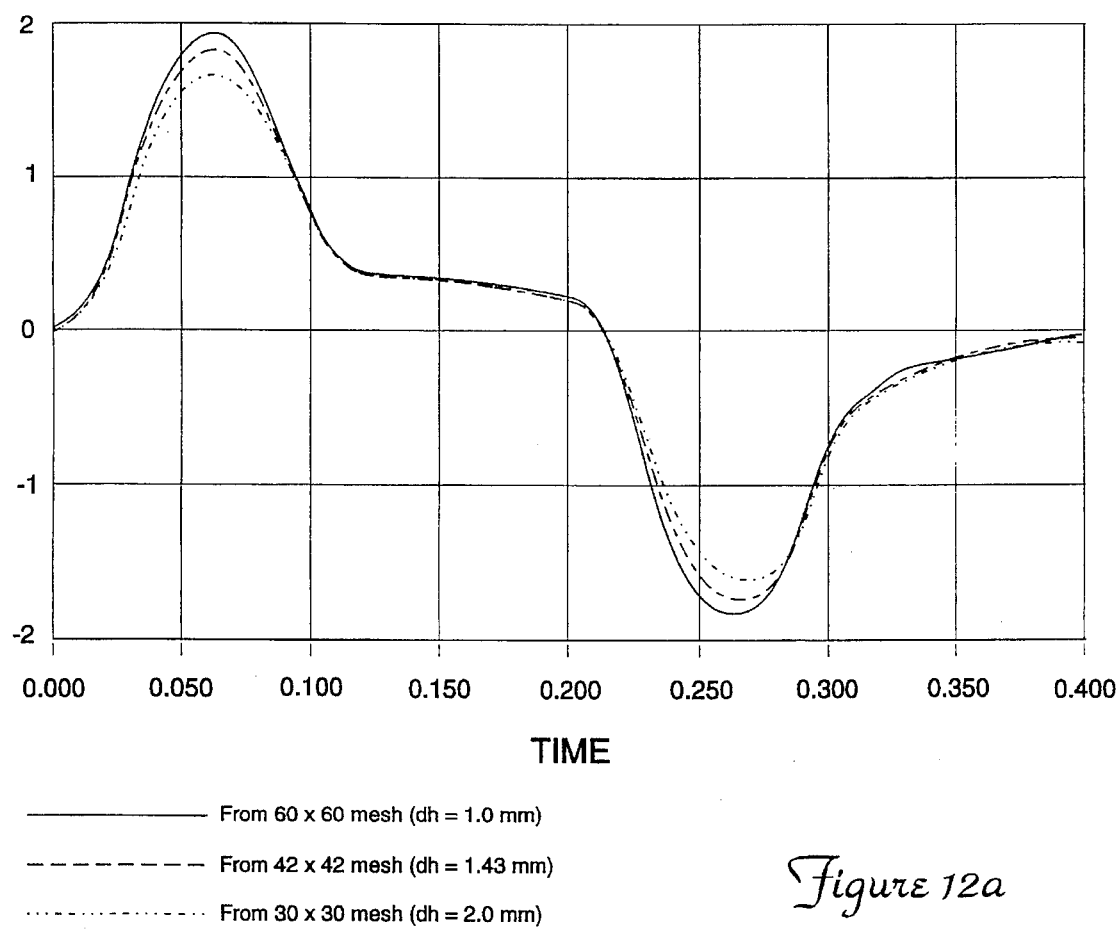
FIG. 12a is a plot of noise voltages computed by IBM® ASTAP.

The current pulse, having a 100 pS rise time and other characteristics as shown in FIG. 10, is applied across a pair of vias located at the center of the power/ground planes as shown in FIG. 9. FIG. 12a shows a plot of the voltage waveform at across the pair of vias, computed by the conventional IBM® ASTAP software. The simulation has been produced using the capacitor/inductor mesh circuit of FIG. 8. The computation has been performed using three different mesh sizes: 30×30 (dh=2.0 mm), 42×42 (dh=1.43 mm) and 60×60 (dh=1.0 mm). As may be seen, three different results may be observed in FIG. 12a, with each result being dependent upon the mesh selected.

Figure 12B:
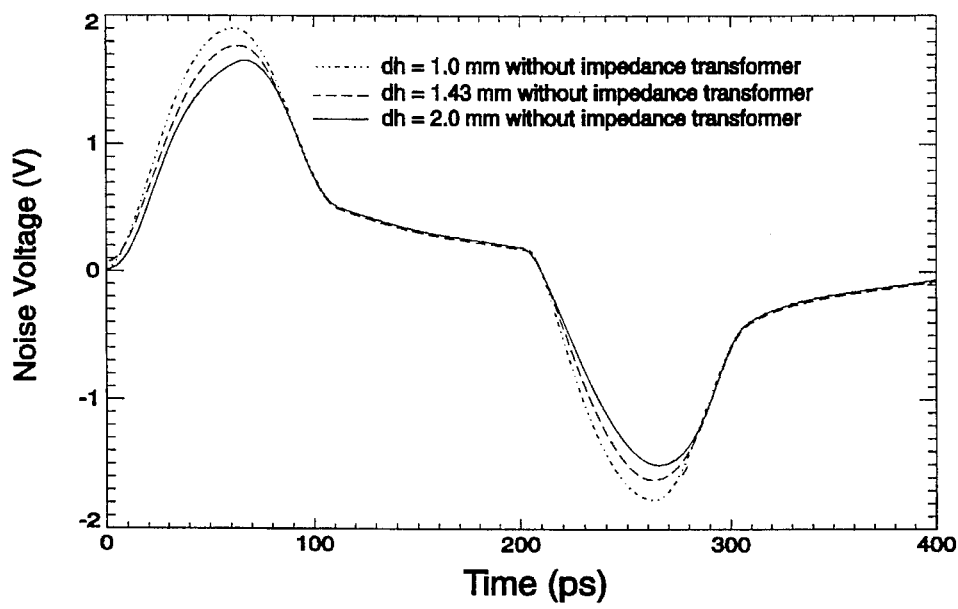
FIG. 12b is a plot of noise voltages computed by the method of the present invention.

Referring now to FIG. 12b, there is shown a similar set of three curves resulting from computations using the finite-difference time-domain (FDTD) method and the same three mesh selections. As may be seen from the set of curves of FIGS. 12a and 12b, numerical solutions obtained from the FDTD method possess the same type of error as those from the capacitor/inductor mesh model in IBM ASTAP software.

Figure 13:
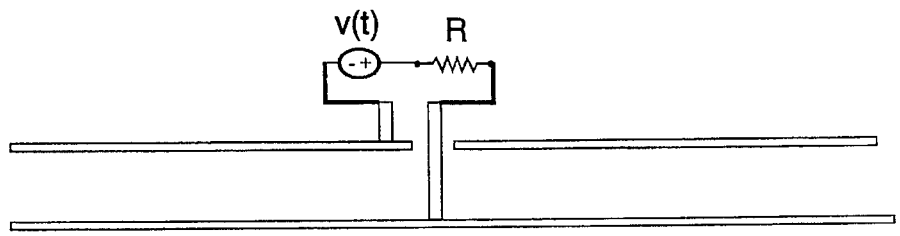
FIG. 13 is a schematic representation of two planes and two vias with a voltage source connected between the two vias.
Figure 14:
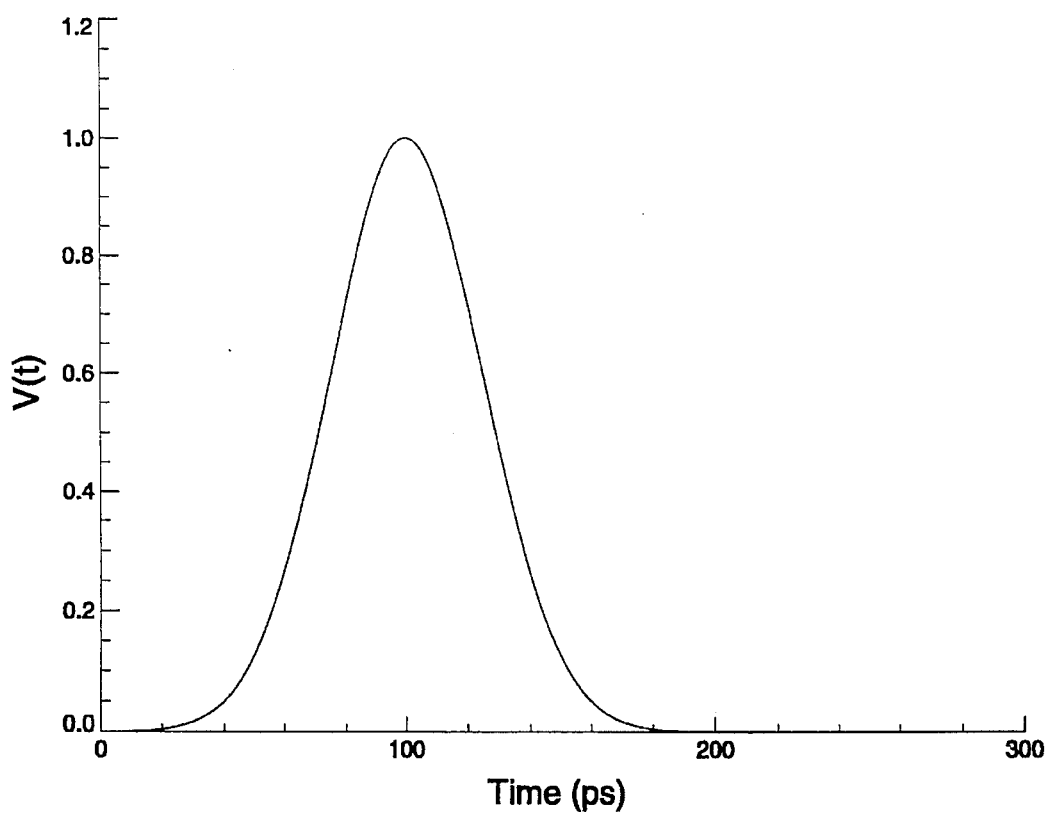
FIG. 14 is a plot of voltage versus time of the applied voltage of FIG. 13.
Figure 15:
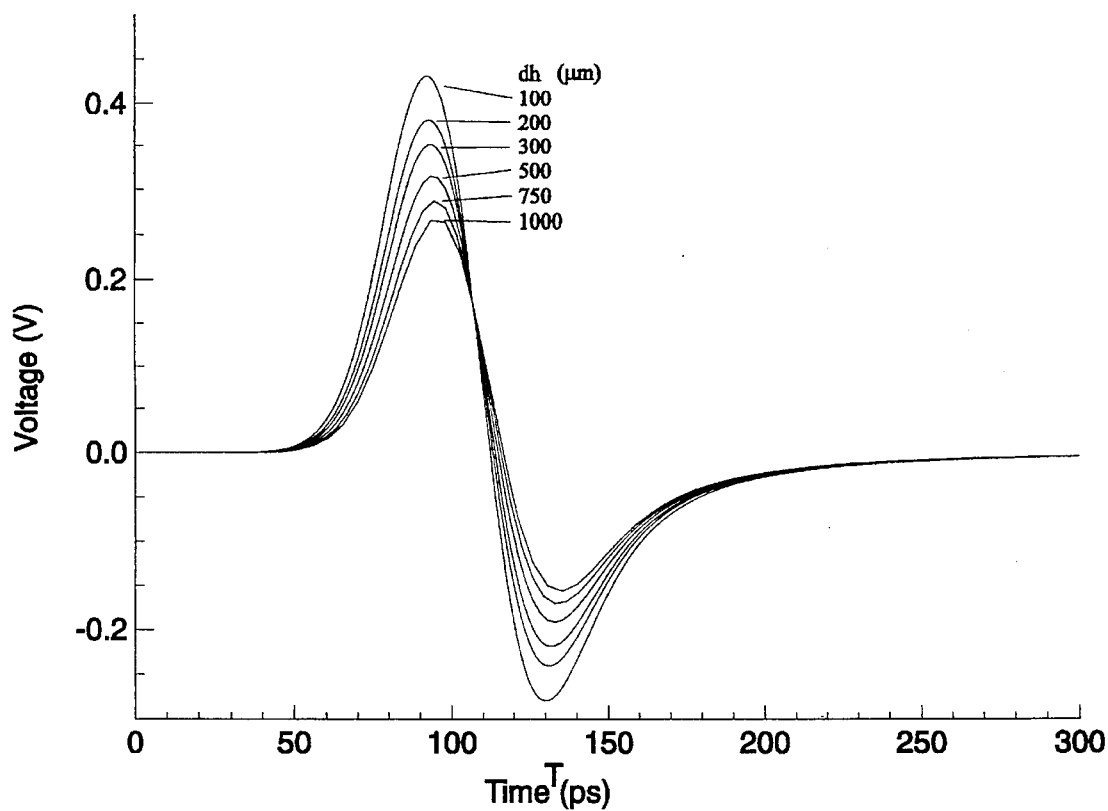
FIG. 15 is a plot of numerically computed transient voltages across the pair of vias of FIG. 13 for various selected mesh sizes.

As a second example, consider the same configuration as that shown in FIG. 9, except the via radius is 50 µm and the pair of vias are connected with a voltage source and a 10 Ω resistor as shown in FIG. 13. The waveform of the voltage source is a Gaussian pulse of an amplitude 1 volt as shown in FIG. 14. A plot of the voltage waveform across the pair of vias is shown in FIG. 15. Results in FIG. 15 are computed by the FDTD method with the size of mesh-element element dh varying from 100 µm to 1000 µm. As can be seen from FIG. 15, simulation results depend on the size of the mesh-element selected.

Figure 16:
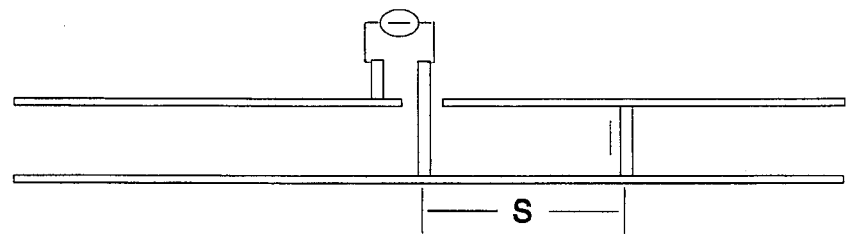
FIG. 16 is a schematic representation of two planes and two vias with a current source connected between the first via and a plane, showing an induced current in the second, short-circuit via.
Figure 17:
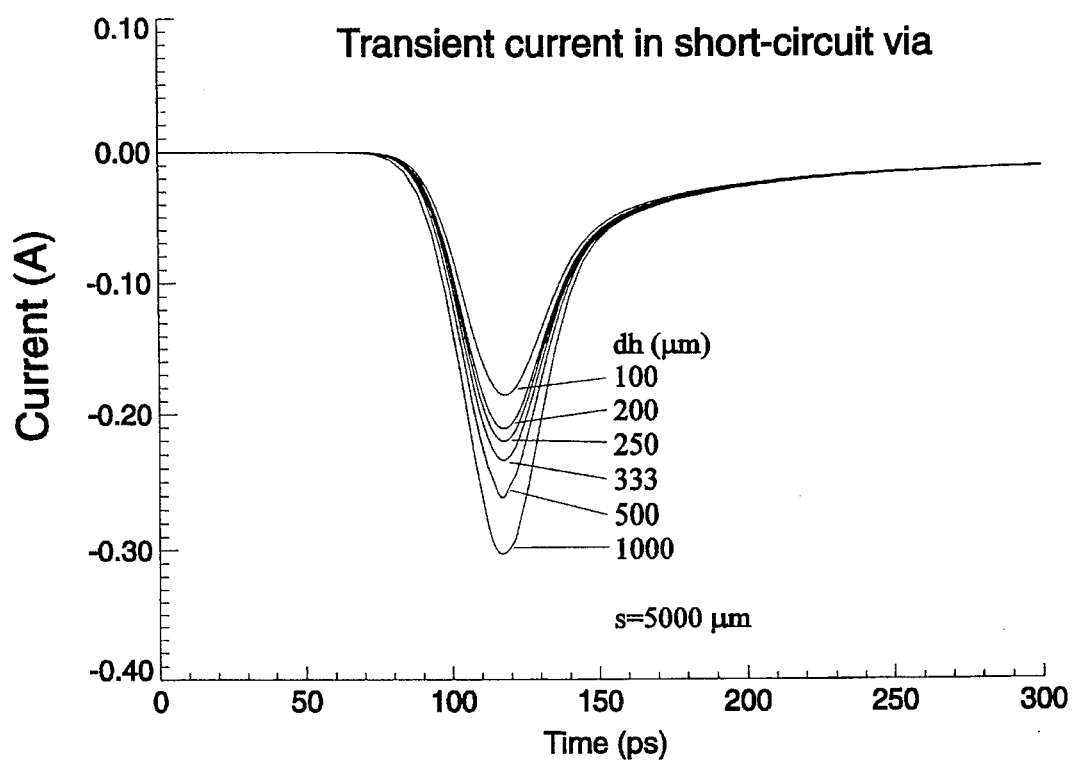
FIG. 17 is a plot of the transient current in the short-circuit via of FIG. 16 as a function of mesh size.

In the third example shown in FIG. 16, the physical configuration is the same as that shown in FIG. 9, except an additional via 404, separated from the via 402 at the center by a distance S=5 mm, is added to connect the two waveform of the current source is a Gaussian pulse of an amplitude 1 ampere. The current induced in via 404 is computed by the FDTD method with various sizes of mesh element dh, and plotted in FIG. 17. As can be seen from FIG. 17, the computed current in via 404 depends on the size of the mesh-element selected.

Figure 18:
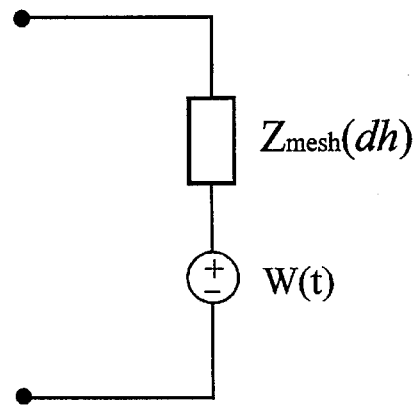
FIG. 18 is a schematic diagram of the equivalent circuit of a numerical mesh at a mesh node.

The source of error in the above simulations can be analyzed as follows. When the power and ground planes are divided by a numerical mesh in the capacitor/inductor mesh model, or the two-dimensional transmission line model, or with the finite-difference and finite-element methods, the input impedance at the mesh node of a mesh of infinite extent is generally not the characteristic impedance of the radial transmission line, which depends on the via radius. Instead, the input impedance of a numerical mesh, denoted as $Z_{mesh}$(dh), depends on the size of the mesh-element dh. Analyzing a mesh at a mesh-node, the characteristics of a mesh of finite extent can be represented by the equivalent circuit shown in FIG. 18, where W(t) represents the voltage due to reflections from the edges of conductive planes, and due to the currents in adjacent vias.

Figure 19:
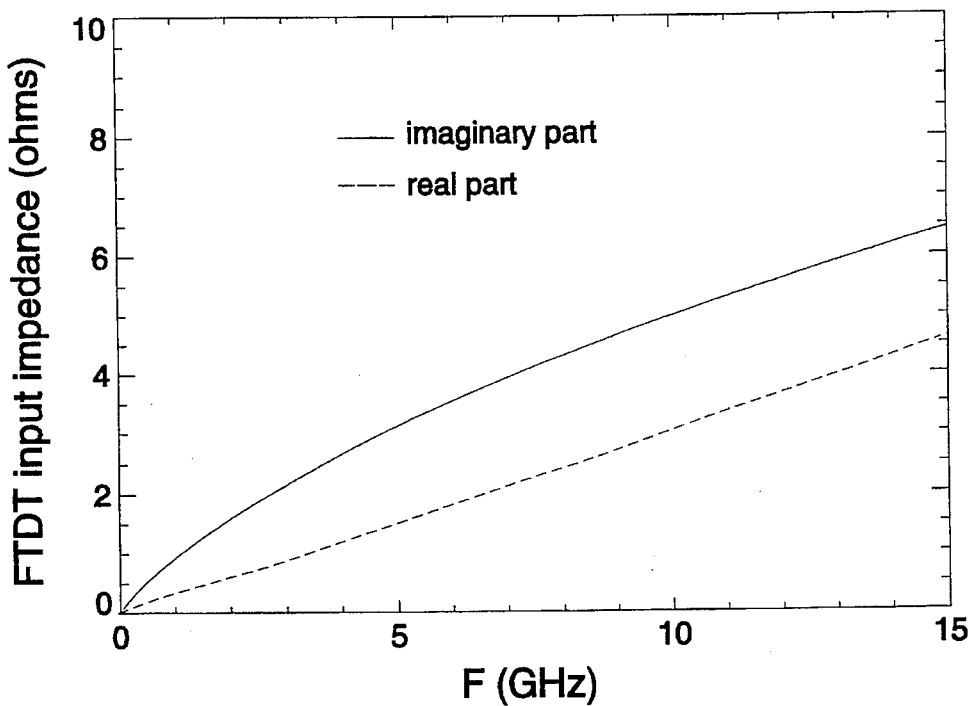
FIG. 19 is a plot of the real and imaginary components of the impedance of a numerical mesh node when the size of the mesh element is 1 mm.

FIG. 19 shows the impedance $Z_{mesh}$(dh) versus frequency for a finite-difference mesh, when the size of the mesh-element dh=1 mm. Notice that the input impedance of the numerical mesh $Z_{mesh}$(dh) is a function of the mesh-element dh, the distance d between two conductive planes, and the permittivity $\epsilon$ of the dielectric material between two conductive planes. The mesh input impedance $Z_{mesh}$(dh), however, is not a function of the via radius a, while the input impedance $Z_0$(a) of the physical structure is.

Since the input impedance $Z_{mesh}$(dh) of a numerical mesh depends on the size of the mesh-element dh, numerical results for the same physical structure, but computed with different sizes of the mesh-element dh, will appear differently, as shown in previous examples.

Figure 20:
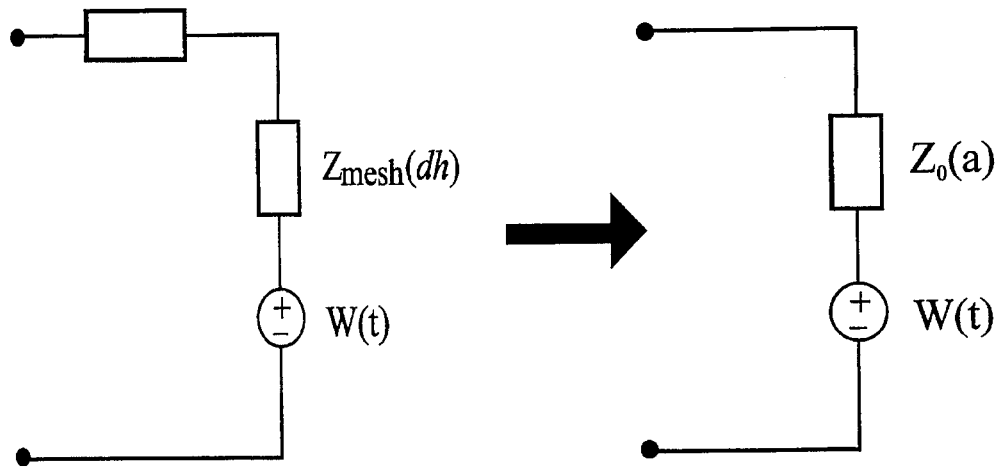
FIG. 20 is a functional diagram showing the transformation of the input impedance of a numerical mesh node to the input impedance of a physical system.

Now referring again to FIG. 6a, the type of error described above can be removed by using the present invention adding an impedance transformer, $Z_d$ 204, between the mesh-node where a via is located and the circuit solver 202. The impedance transformer 204 is set to $Z_0$(a) $-Z_{mesh}$(dh). The function of this impedance transformer 204 is depicted in FIG. 20. With the addition of the impedance transformer 204, the input impedance $Z_{mesh}$(dh) of the numerical mesh is transformed to the impedance $Z_0$(a) of the physical structure which is $Z_d + Z_{mesh}$(dh).

The impedance transformer $Z_d$, which is $Z_0$(a) $-Z_{mesh}$(dh), can be found and implemented through following means.

The characteristic impedance $Z_0$(a) of the physical structure can be found from Equation (1) for a given effective radius of the via together with other physical and material parameters required in Equation (1).

The input impedance $Z_{mesh}$(dh) of a numerical mesh can be found in various ways, either numerically or analytically. To find $Z_{mesh}$(dh) numerically, a current pulse flowing into a mesh node can be numerically simulated, the voltage response at the mesh-node can be recorded, and then the Fourier transform of the current and voltage can be obtained. The input impedance of the numerical mesh can be found simply as the ratio of the Fourier transformed voltage divided by the Fourier transformed current. In performing this calculation, the mesh must be extended far enough so that the value of the current pulse diminishes to approximately zero before reflections from the outer boundaries of the mesh reach the location of the mesh-node where the current source is placed.

The input impedance $Z_{mesh}$(dh) of a numerical mesh can also be found analytically. For the finite-difference method as an example, finite-difference equations can be Fourier transformed into the spatial domain. Then the input impedance of the mesh can be found by taking the inverse Fourier transform of the spatial domain finite-difference equation for the voltage variable at the mesh-node where a current source of unit amplitude is placed. The input impedance $Z_{MESH}(dh)$, shown in FIG. 19, is obtained by this method.

Once the impedance transformer $Z_d$ (generally a frequency-dependent complex variable) is known, the impedance transformer $Z_d$ can be implemented through various means, such as by a lumped circuit network which approximates the frequency response of the impedance transformer $Z_d$. In most practical cases, it is found that $$Z_d = j\omega L_d \tag{5}$$

where $\omega$ is the angular frequency, and $L_d$ is a constant. Equation (5) represents the impedance of an inductor with inductance $L_d$. This inductance $L_d$, like the impedance $Z_d$, is generally a function of the via radius a and the size of the mesh-element dh. More circuit components can be used to obtain more accurate representations of $Z_d$.

Figure 21:
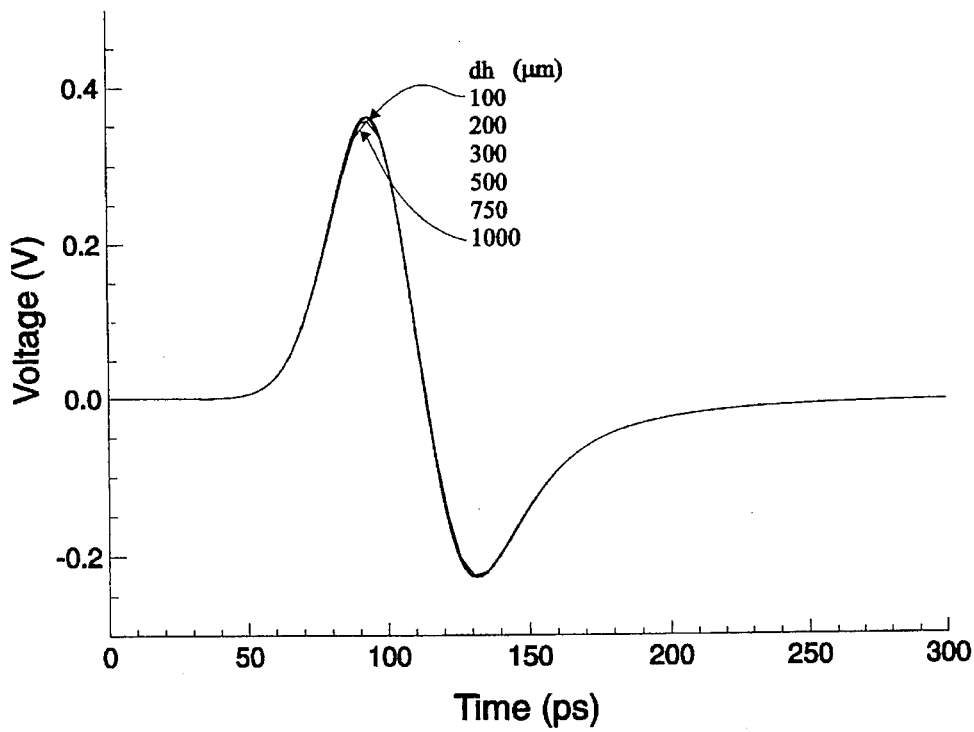
FIG. 21 is a plot of the transient voltages across the pair of vias of FIG. 13 using the impedance transformation techniques of the present invention for various chosen mesh sizes.

To demonstrate the effect of the impedance transformer, consider the configuration shown in FIG. 13. A plot of the voltage waveform across the vias, computed with the impedance transformer, is shown in FIG. 21. Here only one circuit component, an inductor $L_d$ is used to synthesize the impedance transformer $Z_d$. Unlike the waveforms shown FIG. 15, which depend on the size of the mesh-element selected, the simulation results with the impedance transformation all converge to the same solution for different sizes of mesh-element. This converged numerical solution also coincides with the analytic solution by radial transmission line theory.

Figure 22:
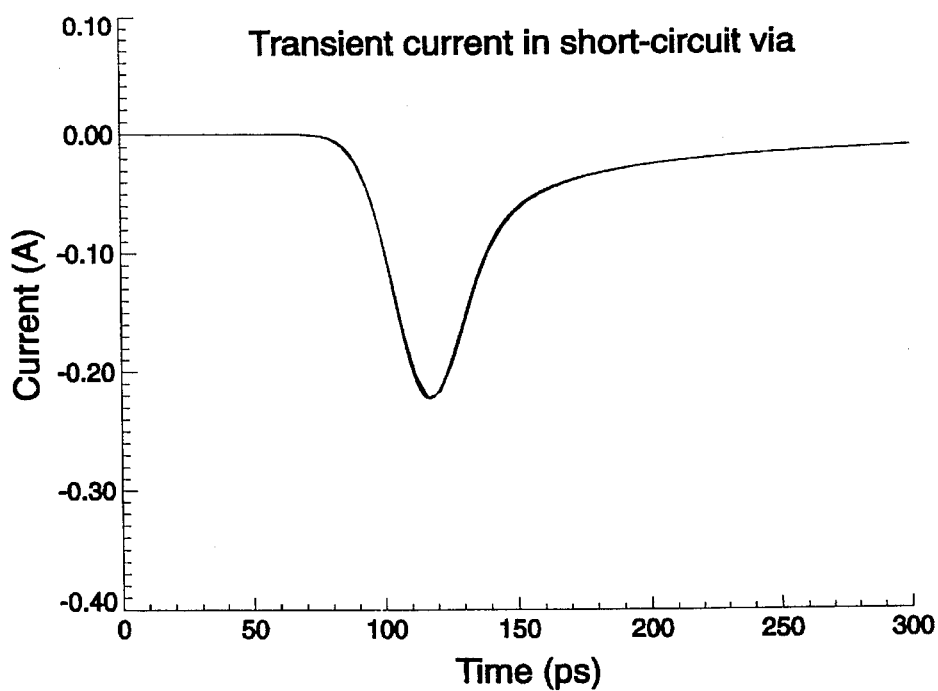
FIG. 22 is a plot of the transient current in a short-circuit via of FIG. 16 for various mesh sizes using the impedance transformation operation of the present invention.

For the configuration shown in FIG. 16, the current induced in via 102 is computed with the impedance transformer shown in FIG. 22. Again, unlike the waveforms (FIG. 17), which depend on the size of the mesh-element selected, the simulation results with the impedance transformation uniformly converge to the same solution for different sizes of mesh-element.

Numerical tests presented above show that the addition of an impedance transformer forces the convergence of numerical solutions when using different meshes, thus making a solution that is virtually independent of the mesh chosen.

The numerical method of the present invention provides a highly accurate, computationally efficient way to simulate the effects of delta-I or similar noise of the voltage and/or ground planes of multilayered electronic packaging structures.

Since other modifications and changes varied to fit particular operating requirements and environments will be apparent to those skilled in the art, the invention is not considered limited to the example chosen for purposes of disclosure, and covers all changes and modifications which do not constitute departure from the true spirit and scope of this invention.

Having thus described the invention, what is desired to be protected by Letters Patent is presented in the subsequent appended claims.

What is claimed is:

1. A method for analyzing voltage fluctuation in multilayered electronic packaging structures, comprising:
   a) providing a physical electronic packaging structure having at least two spaced-apart conductive planes and at least one via disposed between said planes, said physical electronic packaging structure having an inherent input impedance at a portion thereof;
   b) generating values representative of a numerical input impedance of a numerical system that models said physical electronic packaging structure; and
   c) transforming said values representative of said numerical input impedance to conform to the actual input impedance of said portion of said physical electronic packaging structure.

2. The method for analyzing voltage fluctuation in multilayered electronic packaging structures as recited in claim 1, wherein said physical electronic packaging structure comprises at least one ground plane and at least one power plane.

3. The method for analyzing voltage fluctuations in multilayered electronic packaging structures as recited in claim 2, wherein one of said at least one vias is electrically connected to said ground plane while being electrically insulated from said power plane, and wherein another of said at least one vias is disposed between said ground plane and said power plane and electrically connected thereto while being electrically insulated from said ground plane, said vias being disposed proximate one another.

4. The method for analyzing voltage fluctuations in multilayered electronic packaging structures as recited in claim 2, wherein one of said at least one vias is electrically connected to said power plane while being electrically insulated from said ground plane, and wherein another of said at least one vias is disposed between said power plane and said ground plane and electrically connected thereto while being electrically insulated from said power plane, said vias being disposed proximate one another.

5. A method for analyzing voltage fluctuations in multilayered electronic packaging structures, comprising:
   a) providing a physical electronic packaging structure having at least two conductive planes spaced apart from one another and at least one via passing through at least one of said conductive planes, said via having a predetermined radius, and said physical electronic packaging structure having an inherent input impedance at said at least one via;
   b) determining said input impedance at said at least one via;
   c) constructing a numerical model of a portion of said electronic packaging structure, said portion containing said at least one via, said at least one via being a node in said numerical model;
   d) determining an equivalent input impedance at said node of said numerical model;
   e) computing a difference of said input impedance of said at least one via and said equivalent input impedance at said node of said numerical model;
   f) applying an impedance transformer to said numerical model, so that said equivalent input impedance of said node becomes approximately equal to said input impedance at said at least one via; and
   g) solving said numerical model to yield a noise voltage distribution between said conductive planes.

6. The method for analyzing voltage fluctuations in multilayered electronic circuit packaging structures as recited in claim 5, wherein said operation of determining said physical input impedance is performed analytically.

7. The method for analyzing voltage fluctuations in multilayered electronic circuit packaging structures as recited in claim 6, wherein said operation of determining said input impedance analytically comprises analysis of physical parameters of said at least one via.

8. The method for analyzing voltage fluctuations in multilayered electronic circuit packaging structures as recited in claim 7, wherein said physical parameters comprise at least said predetermined radius of said at least one via.

9. The method for analyzing voltage fluctuations in multilayered electronic circuit packaging structures as recited in claim 5, wherein said operation of determining said physical input impedance comprises measuring said input impedance.

10. The method for analyzing voltage fluctuations in multilayered electronic circuit packaging structures as recited in claim 5, wherein said numerical model comprises a mesh for segmentizing said portion of said physical electronic packaging structure.

11. The method for analyzing voltage fluctuations in multilayered electronic circuit packaging structures as recited in claim 5, wherein said operation of solving said numerical model comprises a field solver.

12. The method for analyzing voltage fluctuations in multilayered electronic circuit packaging structures as recited in claim 11, wherein said field solver comprises an FDTD field solver.

13. The method for analyzing voltage fluctuations in multilayered electronic circuit packaging structures as recited in claim 11, wherein said field solver comprises a finite element field solver.

14. The method for analyzing voltage fluctuations in multilayered electronic circuit packaging structures as recited in claim 10, wherein said operation of solving said numerical model comprises evaluating an inductor/capacitor mesh.

15. The method for analyzing voltage fluctuations in multilayered electronic circuit packaging structures as recited in claim 14, wherein said operation of evaluating an inductor/capacitor mesh is performed by a circuit solver.

16. The method for analyzing voltage fluctuations in multilayered electronic circuit packaging structures as recited in claim 10, wherein said operation of solving said numerical model comprises evaluating a transmission line mesh.

* * * * *